(12) United States Patent  
Salters et al.

(10) Patent No.: US 12,503,204 B2  
(45) Date of Patent: Dec. 23, 2025

(54) MARINE SYSTEM COMPRISING AN ANTI-BIOFOULING LIGHT ARRANGMENT THAT INCLUDES A POLARIZING DEVICE

(71) Applicant: KONINKLIJKE PHILIPS N.V., Eindhoven (NL)

(72) Inventors: Bart Andre Salters, Eindhoven (NL); Roelant Boudewijn Hietbrink, Utrecht (NL); Eduard Matheus Johannes Niessen, Ittervoort (NL); Albert Willem Marsman, Valkenswaard (NL)

(73) Assignee: Koninklijke Philips N.V., Eindhoven (NL)

( * ) Notice: Subject to any disclaimer, the term of this patent is extended or adjusted under 35 U.S.C. 154(b) by 706 days.

(21) Appl. No.: 17/798,332

(22) PCT Filed: Jan. 27, 2021

(86) PCT No.: PCT/EP2021/051784  
§ 371 (c)(1),  
(2) Date: Aug. 9, 2022

(87) PCT Pub. No.: WO2021/160425  
PCT Pub. Date: Aug. 19, 2021

(65) Prior Publication Data  
US 2023/0150622 A1    May 18, 2023

(30) Foreign Application Priority Data  
Feb. 12, 2020   (EP) ...................................... 20156861

(51) Int. Cl.  
*B63B 59/04*   (2006.01)  
*A61L 2/10*   (2006.01)  
(Continued)

(52) U.S. Cl.  
CPC ................ *B63B 59/04* (2013.01); *A61L 2/10* (2013.01); *A61L 2/26* (2013.01); *B08B 7/0057* (2013.01);  
(Continued)

(58) Field of Classification Search  
CPC ... A61L 2/10; A61L 2/24; B63B 59/04; H02S 40/10; H02S 40/20  
See application file for complete search history.

(56) References Cited

U.S. PATENT DOCUMENTS

| 5,308,505 A | 5/1994 | Titus et al. |
| 9,955,633 B2 | 5/2018 | Ichihashi |
| 2013/0240025 A1 | 9/2013 | Bersano et al. |

FOREIGN PATENT DOCUMENTS

| DE | 102010026790 A1 | 1/2012 |
| KR | 20190053555 A * | 5/2019 |

(Continued)

OTHER PUBLICATIONS

English translation for KR-20190053555-A (Year: 2019).*  
International Search Report and Written Opinion from PCT/EP2021/051784 mailed Apr. 23, 2021.

*Primary Examiner* — Sean E Conley

(57) ABSTRACT

A marine system (1) comprises a structure (10) that is designed for use in a marine environment, and that includes an exterior surface (11) that is at least intermittently exposed to water during actual use of the structure (10). The marine system (1) further comprises an anti-biofouling light arrangement (20) that is arranged and configured to emit anti-biofouling light towards the exterior surface (11) of the structure (10) in order to perform art anti-biofouling action on the exterior surface (11) of the structure (10), wherein the anti-biofouling light arrangement (20) includes a polarizing device (22) that is arranged in a path of the anti-biofouling light towards the exterior surface (11) of the structure (10)  
(Continued)

and configured to only let light waves of the anti-biofouling light of a specific polarization pass through.

20 Claims, 2 Drawing Sheets

(51) Int. Cl.
*A61L 2/26* (2006.01)
*B08B 7/00* (2006.01)
*B08B 13/00* (2006.01)
*B08B 17/02* (2006.01)
*G02B 27/28* (2006.01)
*H02S 40/10* (2014.01)
*H02S 40/20* (2014.01)
*H02S 50/00* (2014.01)

(52) U.S. Cl.
CPC .............. *B08B 13/00* (2013.01); *B08B 17/02* (2013.01); *G02B 27/288* (2013.01); *H02S 40/10* (2014.12); *H02S 40/20* (2014.12); *A61L 2202/11* (2013.01); *A61L 2202/14* (2013.01); *H02S 50/00* (2013.01)

(56) References Cited

FOREIGN PATENT DOCUMENTS

| WO | 2012003961 A1 | 1/2012 |
| WO | 20160192942 A1 | 12/2016 |
| WO | 201060193055 A1 | 12/2016 |

* cited by examiner

MARINE SYSTEM COMPRISING AN ANTI-BIOFOULING LIGHT ARRANGMENT THAT INCLUDES A POLARIZING DEVICE

CROSS REFERENCE TO RELATED APPLICATIONS

This application is a U.S. national phase application of International Application No. PCT/EP2021/051784 filed on Jan. 27, 2021, which claims the benefit of EP application 2156861.5 filed on Feb. 12, 2020 and is incorporated herein by reference.

FIELD OF THE INVENTION

The invention relates to a marine system comprising a structure designed for use in a marine environment, which structure includes an exterior surface that is at least intermittently exposed to water during actual use of the structure, and an anti-biofouling light arrangement that is arranged and configured to emit anti-biofouling light towards the exterior surface of the structure in order to perform an anti-biofouling action on the exterior surface of the structure.

Further, the invention relates to a method of performing an anti-biofouling action on an exterior surface of a structure designed for use in a marine environment, which surface is at least intermittently exposed to water during actual use of the structure, the method comprising emitting anti-biofouling light towards the exterior surface of the structure.

BACKGROUND OF THE INVENTION

The invention is suitable for use in a context of a concept called "solar-at-sea", according to which floating solar panels including a plurality of solar cells are deployed at sea, for energy production, which may be large scale energy production. The solar-at-sea concept is based on the insight that enormous water areas are available and that water areas may very well be used for the purpose of solar energy production. In this way, situations in which solar panels occupy areas of land which might otherwise be used for agriculture or another valuable purpose can be avoided.

However, using solar panels in marine environments such as seas and oceans involves a need to take measures aimed at prevention of biofouling of the solar panels. The fact is that due to waves, a virtual non-stop flow of fresh water splashes over the solar panels. The water brings along numerous micro-organisms, and without measures as mentioned, the micro-organisms will start to attach to an exterior surface of the solar panels and grow on the surface.

The invention is in the field of performing an anti-biofouling action on an exterior surface of a structure such as a solar panel that is designed for use in a marine environment by means of anti-biofouling light. A practical example of the anti-biofouling light is ultraviolet light, which may especially be of type C. However, it is a known fact that ultraviolet light may be harmful to people and animals. Further, in some cases, ultraviolet light may have negative effects on the structure itself. It is therefore an object of the invention to provide practical measures which on the one hand may be applied to increase safety of people and animals as may be present in the surroundings of a marine system comprising a structure and an anti-biofouling light arrangement, and which on the other hand may be applied to prevent the anti-biofouling light from causing damage to the structure.

SUMMARY OF THE INVENTION

In view of the foregoing, the invention provides a marine system comprising a structure designed for use in a marine environment, which structure includes an exterior surface that is at least intermittently exposed to water during actual use of the structure, and an anti-biofouling light arrangement that is arranged and configured to emit anti-biofouling light towards the exterior surface of the structure in order to perform an anti-biofouling action on the exterior surface of the structure, wherein the anti-biofouling light arrangement includes a polarizing device that is arranged in a path of the anti-biofouling light towards the exterior surface of the structure and configured to only let light waves of the anti-biofouling light of a specific polarization pass through.

It is a commonly known fact that light is an electromagnetic wave, and that the electric field of such a wave oscillates perpendicularly to the direction of propagation. Light is called unpolarized if the direction of this electric field fluctuates randomly in time. Contrariwise, if the direction of the electric field of light is well-defined, light is called polarized light.

The invention focuses on the nature of the anti-biofouling light and has a basis in the acknowledgement that normally, i.e. without a polarizing device being present in the anti-biofouling light arrangement, the light is unpolarized. According to the invention, using a polarizing device in a marine system offers various advantageous possibilities, the exact nature of the advantageous possibilities depending on the setting of the polarizing device. In particular, it is on the one hand possible to have a setting of a polarizing device in which the polarizing device is suitable for reducing the amount of anti-biofouling light that reaches the surroundings of the marine system, and it is on the other hand possible to have a setting of a polarizing device in which the polarizing device is suitable for reducing the amount of anti-biofouling light acting on the structure through the exterior surface thereof in a potentially harmful manner. In both cases, the polarizing device is set to not let the light waves which are of such a polarization that they would otherwise be involved in the undesired effect pass through, i.e. to filter out those light waves. Further, using a polarizing device does not involve any need for radical design changes nor a need for adding complex and/or expensive components.

In conformity with what has been explained earlier, it is noted that a practical example of the structure is a solar structure that is configured to generate electrical energy under the influence of sunlight, wherein the exterior surface of the structure is configured to allow the sunlight to enter the solar structure. For the sake of clarity, it is noted that the term "marine environment" should be understood so as to cover any water environment in which the structure may be present during actual use, including the environments of oceans, seas, natural or artificial lakes, etc. The fact that the structure is designed for use in a marine environment may in practical situations involve a capability of the structure to float on the water surface.

In a conventional situation, anti-biofouling light that travels towards a surface to be subjected to an anti-biofouling action at least partially reflects off the surface and continues towards the surface's surroundings. It is especially this reflected anti-biofouling light that may jeopardize the safety of people and animals, as mentioned in the foregoing. In order to reduce such danger, it is proposed to have a polarizing device that is configured to only let p-polarized light waves of the anti-biofouling light pass through. In this way, the amount of reflected anti-biofouling light can be reduced.

In the context of having a polarizing device that is configured to only let p-polarized light waves of the anti-biofouling light pass through, it may be advantageous if the anti-biofouling light arrangement is arranged and configured to let at least a major part of the anti-biofouling light impinge on the exterior surface of the structure at an incident angle that is in a range of 5° smaller than the Brewster's angle to 5° larger than the Brewster's angle. Applying Brewster's law, it is found that depending on the material of the structure at the position of the exterior surface thereof, particularly the refractive index of the material, it is possible to realize a situation of zero reflection of p-polarized light waves or near-zero reflection of p-polarized light, namely when the incident angle is in the range as mentioned. Taking into account practical possibilities in respect of the structure's design, such as the types of material suitable for use in the structure, particularly at the position of the exterior surface thereof, it may be beneficial to arrange and configure the anti-biofouling light arrangement such that at least a major part of the anti-biofouling light is made to impinge on the exterior surface of the structure at an incident angle that is in a range of about 50° to 60°, for example.

On the other hand, in order to protect the structure, it may be advantageous if the polarizing device is configured to only let s-polarized light waves of the anti-biofouling light pass through. The s-polarized light waves will mainly reflect off the exterior surface of the structure, so that there still is an anti-biofouling effect on the surface without a risk of damage to the structure. In such a case, it is still possible to protect people and animals in the surroundings of the marine system. For example, the marine system may be equipped with a detector arrangement including at least one sensor configured to detect at least one parameter related to living beings being present in the marine's system surroundings, and further including a controller that is configured to receive sensor data from the at least one sensor and to reduce light output of the anti-biofouling light arrangement to a lower level or to zero in case the sensor data represent a positive sensing result. The at least one sensor may be one of i) an infrared detector configured to detect heat of bodies in the marine's system surroundings and ii) a motion detector configured to detect motion of bodies in the marine's system surroundings, for example. As long as no bodies are detected, it is safe to assume that no harm will be done when the s-polarized light waves are allowed to reflect off the exterior surface of the structure. Only in a case of a positive sensing result, i.e. a result representing a presence of at least one body in the vicinity of the marine system, the light output is reduced to a lower level or to zero, wherein it is noted that reducing the light output to zero may involve switching off the anti-biofouling light arrangement. As soon as the sensing result is back to negative, the light output may be set to an operational level again so that the extent to which the anti-biofouling action of the light is hindered/interrupted is only minimal.

The above indication of polarized light waves as p-polarized light waves and s-polarized light waves is to be understood such as to implicitly refer to a coordinate system that is frequently used in the field of polarization theories. Depending on how the electric field is oriented, polarized light is classified into three types of polarizations, namely i) linear polarization, when the electric field of the light is confined to a single plane along the direction of propagation, ii) circular propagation, and iii) elliptical polarization. The two orthogonal linear polarization states that are most important for reflection and transmission are referred to as p-polarization and s-polarization, respectively, wherein p-polarized light is light having an electric field that is polarized parallel to a plane of incidence, while s-polarized light is light having an electric field that is polarized perpendicular to the plane. Hence, when it is desired to use the polarizing device to reduce the amount of reflected anti-biofouling light, i.e. the light that may involve harmful effects in the surroundings of the marine system, this can be done by setting the polarizing device so as to only let p-polarized light waves of the anti-biofouling light pass through, and when it is desired to use the polarizing device to reduce the amount of refracted anti-biofouling light, i.e. the light that may involve harmful effects in the structure that is included in the marine system, this can be done by setting the polarizing device so as to only let s-polarized light waves of the anti-biofouling light pass through.

Within the framework of the invention, it is possible to use one polarizing device in the marine system that can be set in one of two possible modes of operation. In other words, the polarizing device may be configured to only let p-polarized light waves of the anti-biofouling light pass through in one mode of operation, and to only let s-polarized light waves of the anti-biofouling light pass through in another mode of operation. A process of controlling such a type of polarizing device may take place in any appropriate manner. For example, it may be advantageous if the marine system comprises a detector arrangement including at least one sensor, and also a controller that is configured to receive sensor data from the at least one sensor and to set the mode of operation of the polarizing device on the basis of the sensor data. In this context, it may be practical for the at least one sensor to be i) an infrared detector configured to detect heat of bodies in the marine's system surroundings or ii) a motion detector configured to detect motion of bodies in the marine's system surroundings, and for the controller to be configured to set the mode of the operation of the polarizing device in which the polarizing device only lets s-polarized light waves of the anti-biofouling light pass through as a default, and to only set the mode of the operation of the polarizing device in which the polarizing device only lets p-polarized light waves of the anti-biofouling light pass through in case the sensor data represent a positive sensing result. On the basis of such a configuration, the polarizing device is controlled so as to normally polarize the light such that it reflects off the exterior surface of the structure, and to polarize the light such that the amount of reflected light is significantly reduced only as long as it is determined that living/moving beings are present near the marine system.

Changing between the two modes of operation of the polarizing device may take place in an uncomplicated manner if the polarizing device is rotatable in the anti-biofouling light arrangement, at least over 90°. This concept is based on the known fact that a certain type of polarizing filter can be used for achieving different polarizing effects, depending on the orientation of the polarizing filter with respect to a light source. If in the one position an arrangement is obtained in which the polarizing filter only allows p-polarized light waves of the anti-biofouling light to pass through, then in another position that is rotated a quarter turn with respect to the one position, an arrangement is obtained in which the polarizing filter only allows s-polarized light waves of the anti-biofouling light to pass through. The polarizing device may be rotatable back and forth between two different positions, or may be rotatable in one direction, from one position to a subsequent position along a quarter turn.

Alternatively, an assembly of two polarizers, one of each kind, may be used, in which the polarizers may be arranged next to each other, for example. In such a case, switching between the two modes of operation can be achieved by simply shifting the assembly of polarizers, wherein the appropriate polarizer is positioned in front of the light source (and the other one is rendered 'inoperative' by positioning it adjacent the area covered by the anti-biofouling light).

The polarizing device may be of any suitable design. For example, it may be so that the polarizing device comprises one of a i) polarizer and ii) a polarizing beam splitter in combination with a half-wave plate. When the two options are compared, it is found that when a polarizer is used, 50% of the light is discarded, whereas this is not the case when a beam splitter in combination with a half-wave plate is used. Hence, if it is desired to realize a light output that is as high as possible, it is advantageous to apply the second option.

It may be very practical if the anti-biofouling light arrangement is supported on the exterior surface of the structure through a support. For example, the structure may comprise a panel-shaped element and may very well be suitable for the purpose of carrying a support as mentioned on its exterior surface. Not needing to have an additional supporting structure contributes to simplicity of design of the marine system according to the invention. In this respect, it is further noted that the support may simply comprise a piece of silicone, and that in such a case, the anti-biofouling light arrangement may comprise at least one light source that is embedded in the piece of silicone.

As has already been mentioned in respect of the prior art, a practical example of the anti-biofouling light is ultraviolet light, particularly ultraviolet light of type C.

In an advantageous embodiment, the anti-biofouling light arrangement includes a lens arrangement that is arranged in the path of at least a part of the anti-biofouling light towards the exterior surface of the structure and configured to let the at least a part of the anti-biofouling light impinge on the exterior surface of the structure at an incident angle that is in a defined range by focusing the anti-biofouling light. The defined range of the incident angle may be a defined range including the Brewster's angle, as suggested in the foregoing. It may be practical if the polarizing device is arranged on the lens arrangement.

In conformity with what has been explained in the foregoing, the invention also relates to a method of performing an anti-biofouling action on an exterior surface of a structure designed for use in a marine environment, which surface is at least intermittently exposed to water during actual use of the structure, the method comprising emitting anti-biofouling light towards the exterior surface of the structure and letting the anti-biofouling light, on its way towards the exterior surface of the structure, pass through a polarizing device that is configured to only let light waves of the anti-biofouling light of a specific polarization pass through.

The above-described and other aspects of the invention will be apparent from and elucidated with reference to the following detailed description of an exemplary practical embodiment of a marine system comprising a structure designed for use in a marine environment and an anti-biofouling light arrangement that is arranged and configured to emit anti-biofouling light towards an exterior surface of the structure.

BRIEF DESCRIPTION OF THE DRAWINGS

The invention will now be explained in greater detail with reference to the figures, in which equal or similar parts are indicated by the same reference signs, and in which.

DETAILED DESCRIPTION OF THE EMBODIMENTS

Figure 1:
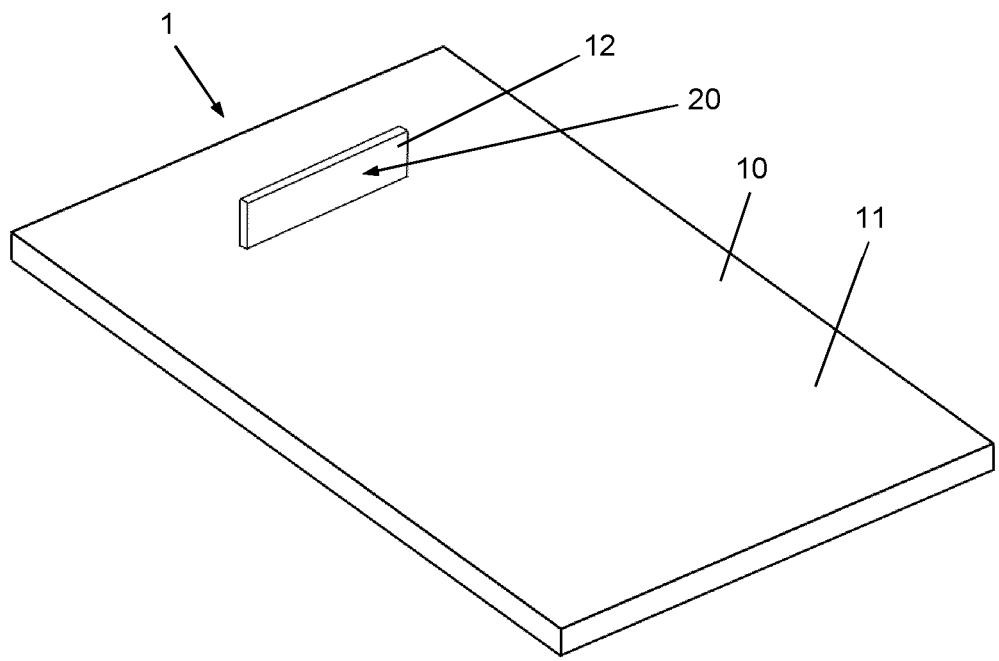
FIG. 1 diagrammatically shows a perspective view of a marine system comprising a structure designed for use in a marine environment and an anti-biofouling light arrangement that is arranged and configured to emit anti-biofouling light towards an exterior surface of the structure, wherein the anti-biofouling light arrangement is supported on the exterior surface of the structure through a support.
Figure 2:
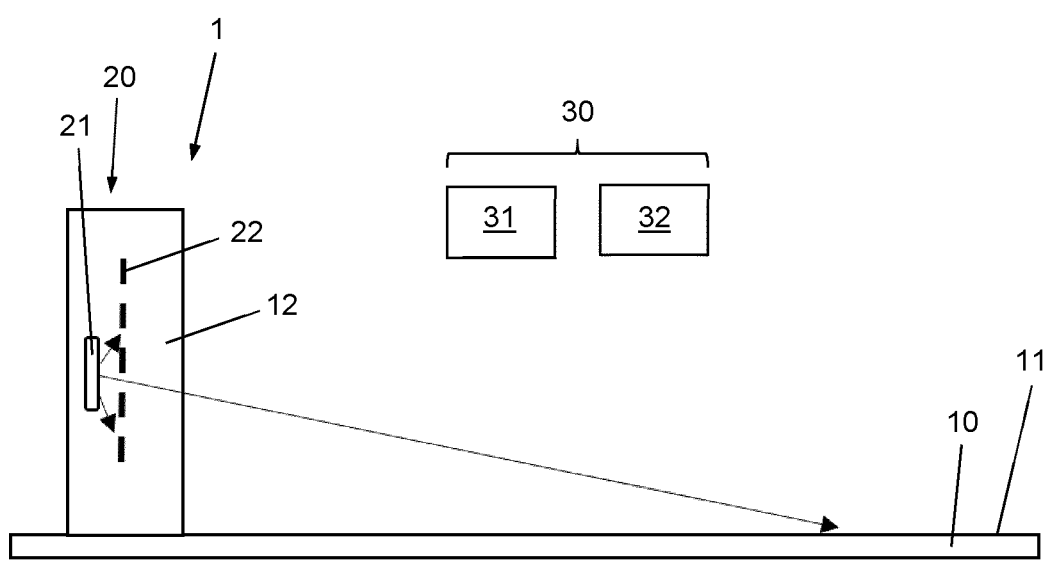
FIG. 2 diagrammatically shows a sectional view of the structure and the support accommodating the anti-biofouling light arrangement, and further diagrammatically shows a detector arrangement that may be included of the marine system as well.

FIGS. 1 and 2 illustrate various aspects of a marine system 1 according to a practical embodiment of the invention, which aspects will be mentioned and explained in the following.

The marine system 1 comprises a structure 10 that is designed for use in a marine environment. The structure 10 includes an exterior surface 11 that is at least intermittently exposed to water during actual use of the structure 10, which water may especially be water from the marine environment and/or water from rain or other (natural) phenomena. The structure 10 may be of any suitable shape and size and is in the figures only diagrammatically depicted as a rectangular slab. A practical example of the structure 10 is a solar panel including a plurality of solar cells and being designed to float on the water surface, which does not mean that other examples are not covered by the invention as well, such as a ship's deck.

The marine system 1 further comprises an anti-biofouling light arrangement 20 that is arranged and configured to emit anti-biofouling light towards the exterior surface 11 of the structure 10 in order to perform an anti-biofouling action on the exterior surface 11 of the structure 10. By using the anti-biofouling light arrangement 20, it is avoided that the exterior surface 11 of the structure 10 gets covered with microorganisms as time passes. In the context of the example of the solar panel, this is important as otherwise the receipt of solar light in the solar cells would be hindered as a result of the presence of the microorganisms, which would deteriorate the energy-generating functionality of the solar cells.

In respect of the application of the anti-biofouling light arrangement 20 in the marine system 1, it is noted that it is a known fact that it is possible to keep a surface clean from biofouling when the surface is exposed to an appropriate dose of an appropriate type of light, continually or from time to time. A practical example of an appropriate type of light is ultraviolet light. The anti-biofouling light arrangement 20 may comprise one or more light sources 21 such as a plurality of UV-C LEDs or one or more tubular fluorescent lamps.

The anti-biofouling light arrangement 20 includes a polarizing device 22 that is arranged in a path of the anti-biofouling light towards the exterior surface 11 of the structure 10, and that is configured to only let light waves of the anti-biofouling light of a specific polarization pass through and to not let light waves of other polarizations pass through. This functionality of the polarizing device 22 is illustrated in FIG. 2, wherein a long arrow ending at the exterior surface 11 of the structure 10 represents a light wave that is allowed to pass through, and wherein two short arrows ending at the polarizing device 22 represent light waves which are not allowed to pass through. The polarizing device 22 may comprise a polarizer or a polarizing beam splitter in combination with a half-wave plate, for example.

In the embodiment of the marine system 1 that is illustrated in the figures, the anti-biofouling light arrangement 20 is supported on the exterior surface 11 of the structure 10 through a support 12. The support 12 may comprise a piece of silicone, for example, in which case the at least one light source 21 of the anti-biofouling light arrangement 20 may be embedded in the piece of silicone, so that both the at least one light source 21 cannot be contacted by water during actual use of the structure 10. The polarizing device 22 may be embedded in the piece of silicone as well, although this is not necessary and may in fact only be practical in embodiments which do not involve movability of the polarizing device 22.

Depending on the desired polarization effect, the polarizing device 22 may be one of various possible types. In the first place, the polarizing device 22 may be of a type that is configured to only let p-polarized light waves of the anti-biofouling light pass through. In the second place, the polarizing device 22 may be of a type that is configured to only let s-polarized light waves of the anti-biofouling light pass through. In the third place, the polarizing device 22 may be of a type that is operable in one of two possible modes of operation, one mode of operation being for only letting p-polarized light waves of the anti-biofouling light pass through, and another mode of operation being for only letting s-polarized light waves of the anti-biofouling light pass through. In any case, by using a polarizing device 22, it is possible to control the amount of anti-biofouling light that reaches the surroundings of the structure 10 and/or to control the amount of anti-biofouling light that penetrates in the structure 10, by only allowing the light waves of a relevant polarization to pass through.

Optionally, the marine system 1 comprises a detector arrangement 30 including at least one sensor 31, as diagrammatically shown in FIG. 2 in the form of a block. Such a detector arrangement 30 may be used to switch the at least one light source 21 on and off and/or to control operation of the polarizing device 22. In the case in which the polarizing device 22 is configured to only let s-polarized light waves of the anti-biofouling light pass through, safety of living beings as may be present in the vicinity of the marine system 1 may be enhanced by using the detector arrangement 30 to detect at least one parameter related to the presence of living beings and reducing the light output of the anti-biofouling light arrangement 20 to a lower level or to zero in case the sensor data represent a positive sensing result. The light output reducing functionality may be performed by means of a controller 32, as diagrammatically shown in FIG. 2 in the form of another block. Such a controller 32 may particularly be configured to control a supply of energy to the at least one light source 21 of the anti-biofouling light arrangement 20. In the case in which the polarizing device 22 is configured to only let p-polarized light waves of the anti-biofouling light pass through in one mode of operation, and to only let s-polarized light waves of the anti-biofouling light pass through in another mode of operation, it may be appropriate to have a controller 32 that is configured to set the mode of operation of the polarizing device 22 on the basis of sensor data received from the at least one sensor of the detector arrangement 30. For example, such a controller 32 may be configured to set the mode of the operation of the polarizing device 22 in which the polarizing device 22 only lets s-polarized light waves of the anti-biofouling light pass through as a default, and to only set the mode of the operation of the polarizing device 22 in which the polarizing device 22 only lets p-polarized light waves of the anti-biofouling light pass through in case the sensor data indicate that living beings are present in the vicinity of the marine system 1.

In case a detector arrangement 30 including at least one sensor 31 and a controller 32 is used in the marine system 1, indeed, the at least one sensor 31 and the controller 32 may have any suitable position with respect to the structure 10 and the anti-biofouling light arrangement 20. For example, assuming that the marine system 1 comprises the support 12 on the exterior surface 11 of the structure 10 as shown in the figures and described in the foregoing, the at least one sensor 31 and/or the controller 32 may be arranged in or on the support 12, or near the support 12. In general, it is useful if the detector arrangement 30 is positioned such that it is possible to detect living beings in a direction of emission of the anti-biofouling light.

Figure 3:
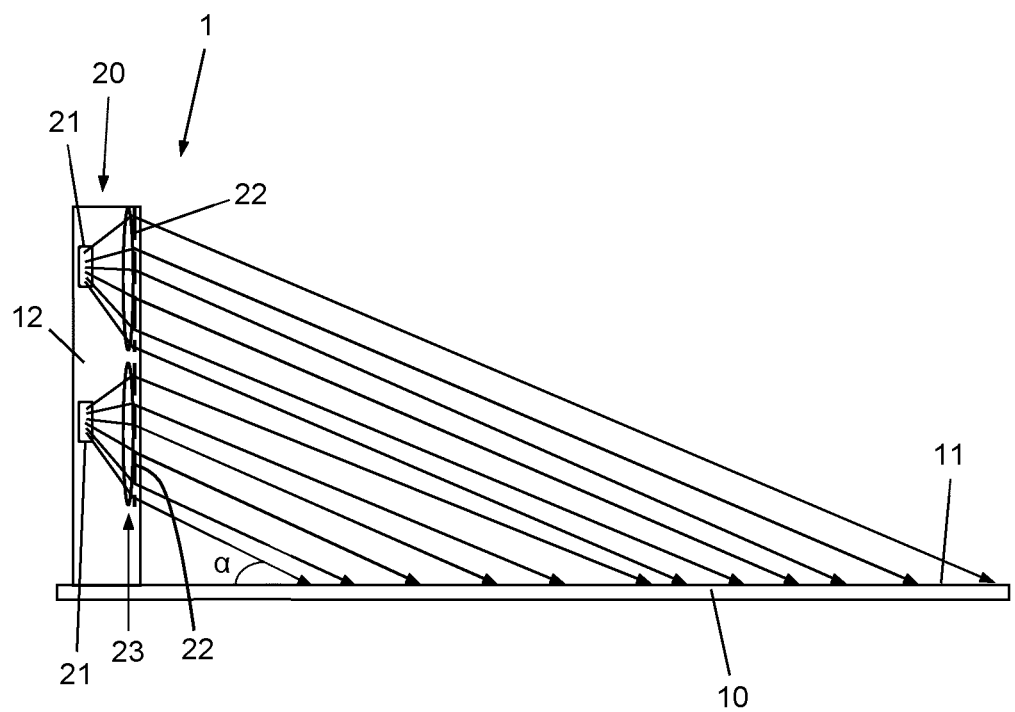
FIG. 3 diagrammatically shows a sectional view of the structure and the support accommodating the anti-biofouling light arrangement and serves to illustrate an option of the anti-biofouling light arrangement including a lens arrangement.

With reference to FIG. 3, it is noted that it is possible for the anti-biofouling light arrangement 20 to include a lens arrangement 23 for focusing the anti-biofouling light. Without such a lens arrangement 23 being present or other measures for influencing the direction of the anti-biofouling light, it is to be expected that light waves of the anti-biofouling light, diagrammatically depicted as arrows in FIG. 3, are oriented in different directions so that a wide range of incident angles $\alpha$ at which the anti-biofouling light impinges on the exterior surface 11 of the structure 10 is obtained. Contrariwise, by means of a lens arrangement 23, it is possible to focus the anti-biofouling light so that the light waves are aligned and the incident angle $\alpha$ is more or less the same for each of the light waves. This enables practical realization of an incident angle $\alpha$ that is in a defined range, such as an incident angle $\alpha$ that is equal to or close to the Brewster's angle in order to ensure zero reflection of p-polarized light waves or near-zero reflection of p-polarized light. Another advantage of having a lens arrangement 23 is that a better distribution of light intensity in the path of the anti-biofouling light from the at least one light source 21 towards the exterior surface 11 of the structure 10 may be realized.

It may be practical if the lens arrangement 23 serves as a carrier of the polarizing device 22. If the polarizing device 22 is of the type that is operable in one of two possible modes of operation and the two possible modes of operation involve two possible positions of at least a part of the polarizing device 22, the lens arrangement 23 may be arranged so as to be movable between one position for keeping the at least a part of the polarizing device 22 in the one possible position thereof and another position for keeping the at least a part of the polarizing device 22 in the other possible position thereof. The lens arrangement 23 may include any suitable number of lenses, with a minimum of one lens. As an example, FIG. 3 shows a lens arrangement 23 including two lenses. In this shown example, the anti-biofouling light arrangement 20 comprises two light sources 21, wherein one of the lenses is arranged in front of one of the light sources 21, and wherein the other of the lenses is arranged in front of the other of the light sources 21. In practical embodiments, the at least one lens of the lens arrangement 23 is a positive lens.

In practice, the lens arrangement 23 does not need to be of perfect quality as the lens arrangement 23 is not used to realize a perfectly sharp image or the like, but rather to focus the anti-biofouling light so that the incident angle α of the light on the exterior surface 11 of the structure 10 is within acceptable limits. Therefore, it may suffice to have a relatively cheap lens arrangement 23 in the anti-biofouling light arrangement 20.

Figure 4:
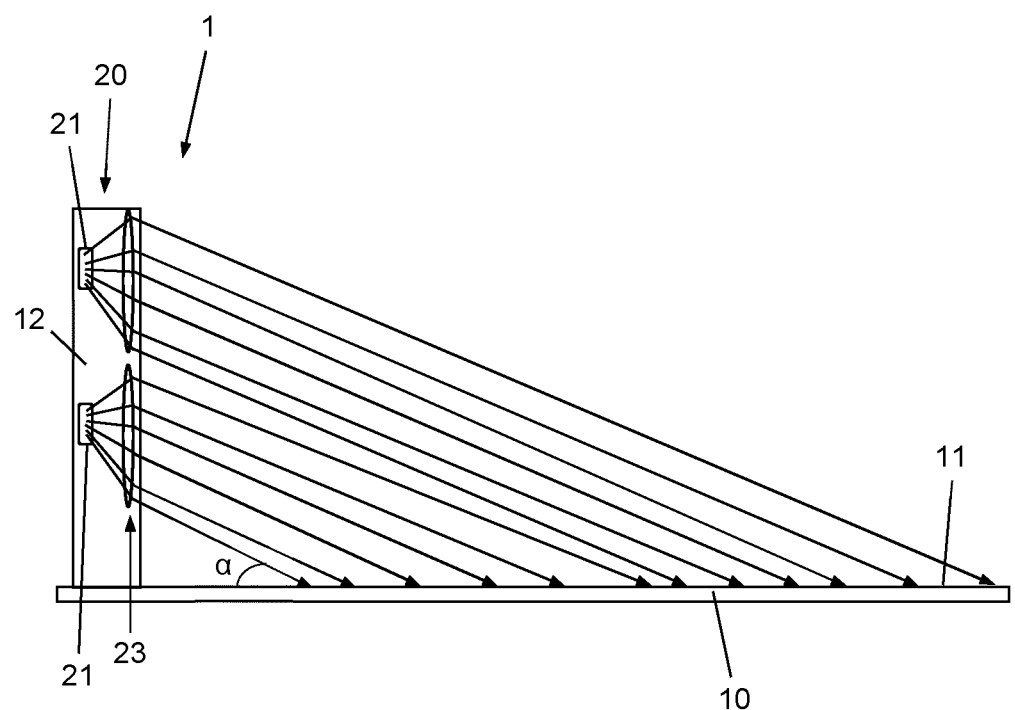
FIG. 4 relates to another embodiment of a marine system and diagrammatically shows a sectional view of the structure and the support accommodating the anti-biofouling light arrangement of the marine system.

It is to be noted that the lens arrangement 23 can be applied in both a marine system 1 as described in the foregoing, particularly a marine system 1 comprising an anti-biofouling light arrangement 20 that includes a polarizing device 22, and an alternative marine system 2 in which the polarizing device 22 is emitted from the anti-biofouling light arrangement 20. The alternative marine system 2 is illustrated and FIG. 4 and may be equal to the marine system 1 as described in the foregoing apart from the difference residing in the absence of the polarizing device 22.

In general, in another aspect, the invention relates to a marine system 2 comprising a structure 10 designed for use in a marine environment, which structure 10 includes an exterior surface 11 that is at least intermittently exposed to water during actual use of the structure 10, and an anti-biofouling light arrangement 20 that is arranged and configured to emit anti-biofouling light towards the exterior surface 11 of the structure 10 in order to perform an anti-biofouling action on the exterior surface 11 of the structure 10, wherein the anti-biofouling light arrangement 20 includes a lens arrangement 23 that is arranged in a path of at least a part of the anti-biofouling light towards the exterior surface 11 of the structure 10 and configured to let the at least a part of the anti-biofouling light impinge on the exterior surface 11 of the structure 10 at an incident angle α that is in a defined range by focusing the anti-biofouling light.

Features of the marine system 1 that includes the polarizing device 22 are equally applicable to the marine system 2 that is without the polarizing device 22 unless they are intrinsically linked to the presence of the polarizing device 22. Among other things, this implies that in the context of the marine system 2 that is without the polarizing device 22, it is possible that

- the structure 10 is a solar structure that is configured to generate electrical energy under the influence of sunlight, wherein the exterior surface 11 of the structure 10 is configured to allow the sunlight to enter the solar structure;
- the marine system 2 comprises a detector arrangement 30 including at least one sensor 31 configured to detect at least one parameter related to living beings being present in the marine's system surroundings, and further including a controller 32 that is configured to receive sensor data from the at least one sensor 31 and to reduce light output of the anti-biofouling light arrangement 20 to a lower level or to zero in case the sensor data represent a positive sensing result;
- the anti-biofouling light arrangement 20 is supported on the exterior surface 11 of the structure 10 through a support 12;
- the lens arrangement 23 includes one or more lenses;
- in case the lens arrangement 23 comprises a number of lenses of two or more, an equal number of light sources 21 is provided, wherein each of the lenses is arranged in front of another of the light sources 21; and the at least one lens of the lens arrangement 23 is a positive lens.

It will be clear to a person skilled in the art that the scope of the invention is not limited to the examples discussed in the foregoing, but that several amendments and modifications thereof are possible without deviating from the scope of the invention as defined in the attached claims. It is intended that the invention be construed as including all such amendments and modifications insofar they come within the scope of the claims or the equivalents thereof. While the invention has been illustrated and described in detail in the figures and the description, such illustration and description are to be considered illustrative or exemplary only, and not restrictive. The invention is not limited to the disclosed embodiments. The drawings are schematic, wherein details which are not required for understanding the invention may have been omitted, and not necessarily to scale.

Variations to the disclosed embodiments can be understood and effected by a person skilled in the art in practicing the claimed invention, from a study of the figures, the description and the attached claims. In the claims, the word "comprising" does not exclude other steps or elements, and the indefinite article "a" or "an" does not exclude a plurality. Any reference signs in the claims should not be construed as limiting the scope of the invention.

Elements and aspects discussed for or in relation with a particular embodiment may be suitably combined with elements and aspects of other embodiments, unless explicitly stated otherwise. Thus, the mere fact that certain measures are recited in mutually different dependent claims does not indicate that a combination of these measures cannot be used to advantage.

The terms "comprise" and "include" as used in this text will be understood by a person skilled in the art as covering the term "consist of". Hence, the term "comprise" or "include" may in respect of an embodiment mean "consist of", but may in another embodiment mean "contain/have/be equipped with at least the defined species and optionally one or more other species".

The invention claimed is:

1. A marine system comprising:
a structure including an exterior surface that is at least intermittently exposed to water during actual use of the structure; and
an anti-biofouling light arrangement that is arranged and configured to emit anti-biofouling light towards the exterior surface of the structure in order to perform an anti-biofouling action on the exterior surface of the structure;
wherein the anti-biofouling light arrangement includes a polarizing device that is arranged in a path of the anti-biofouling light towards the exterior surface of the structure and configured to only let p-polarized and/or s-polarized light waves of the anti-biofouling light pass through.

2. The marine system of claim 1, wherein the structure is a solar structure that is configured to generate electrical energy under the influence of sunlight, and wherein the exterior surface of the structure is configured to allow the sunlight to enter the solar structure.

3. The marine system of claim 1, wherein the anti-biofouling light arrangement is arranged and configured to let at least a major part of the anti-biofouling light impinge on the exterior surface of the structure at an incident angle (α) that is in a range of 5° smaller than the Brewster's angle to 5° larger than the Brewster's angle.

4. The marine system of claim 1, further comprising a detector arrangement including at least one sensor configured to detect at least one parameter related to living beings being present in the marine's system surroundings, and further including a controller that is configured to receive sensor data from the at least one sensor and to reduce light output of the anti-biofouling light arrangement to a lower level or to zero in case the sensor data represent a positive sensing result.

5. The marine system of claim 1, wherein the polarizing device is configured to only let p-polarized light waves of the anti-biofouling light pass through in one mode of operation, and to only let s-polarized light waves of the anti-biofouling light pass through in another mode of operation.

6. The marine system of claim 5, further comprising a detector arrangement including at least one sensor, and further comprising a controller that is configured to receive sensor data from the at least one sensor and to set the mode of operation of the polarizing device on the basis of the sensor data.

7. The marine system of claim 6, wherein the at least one sensor is configured to detect at least one parameter related to living beings being present in the marine's system surroundings, and wherein the controller is configured to set the mode of the operation of the polarizing device in which the polarizing device only lets s-polarized light waves of the anti-biofouling light pass through as a default, and to only set the mode of the operation of the polarizing device in which the polarizing device only lets p-polarized light waves of the anti-biofouling light pass through in case the sensor data represent a positive sensing result.

8. The marine system of claim 5, wherein the polarizing device is rotatable in the anti-biofouling light arrangement, at least over 90°.

9. The marine system of claim 1, wherein the polarizing device comprises one of a i) polarizer and ii) a polarizing beam splitter in combination with a half-wave plate.

10. The marine system of claim 1, wherein the anti-biofouling light arrangement is supported on the exterior surface of the structure through a support.

11. The marine system of claim 1, wherein the anti-biofouling light arrangement includes a lens arrangement that is arranged in the path of at least a part of the anti-biofouling light towards the exterior surface of the structure and configured to let the at least a part of the anti-biofouling light impinge on the exterior surface of the structure at an incident angle (a) that is in a defined range by focusing the anti-biofouling light.

12. The marine system of claim 11, wherein the polarizing device is arranged on the lens arrangement.

13. A method of performing an anti-biofouling action on an exterior surface of a structure designed for use in a marine environment, which surface is at least intermittently exposed to water during actual use of the structure, the method comprising emitting anti-biofouling light towards the exterior surface of the structure and letting the anti-biofouling light, on its way towards the exterior surface of the structure, pass through a polarizing device that is configured to only let p-polarized and/or s-polarized light waves of the anti-biofouling light pass through.

14. The method of claim 13, wherein the structure is a solar structure that is configured to generate electrical energy under the influence of sunlight, and wherein the exterior surface of the structure is configured to allow the sunlight to enter the solar structure.

15. The method of claim 13, wherein the anti-biofouling light arrangement is arranged and configured to let at least a major part of the anti-biofouling light impinge on the exterior surface of the structure at an incident angle ($\alpha$) that is in a range of 5° smaller than the Brewster's angle to 5° larger than the Brewster's angle.

16. The method of claim 13, further comprising a detector arrangement including at least one sensor configured to detect at least one parameter related to living beings being present in the marine's system surroundings, and further including a controller that is configured to receive sensor data from the at least one sensor and to reduce light output of the anti-biofouling light arrangement to a lower level or to zero in case the sensor data represent a positive sensing result.

17. The method of claim 13, wherein the polarizing device is configured to only let p-polarized light waves of the anti-biofouling light pass through in one mode of operation, and to only let s-polarized light waves of the anti-biofouling light pass through in another mode of operation.

18. The method of claim 17, further comprising a detector arrangement including at least one sensor, and further comprising a controller that is configured to receive sensor data from the at least one sensor and to set the mode of operation of the polarizing device on the basis of the sensor data.

19. The method of claim 18, wherein the at least one sensor is configured to detect at least one parameter related to living beings being present in the marine's system surroundings, and wherein the controller is configured to set the mode of the operation of the polarizing device in which the polarizing device only lets s-polarized light waves of the anti-biofouling light pass through as a default, and to only set the mode of the operation of the polarizing device in which the polarizing device only lets p-polarized light waves of the anti-biofouling light pass through in case the sensor data represent a positive sensing result.

20. The method of claim 13, wherein the anti-biofouling light arrangement includes a lens arrangement that is arranged in the path of at least a part of the anti-biofouling light towards the exterior surface of the structure and configured to let the at least a part of the anti-biofouling light impinge on the exterior surface of the structure at an incident angle (a) that is in a defined range by focusing the anti-biofouling light.

* * * * *